United States Patent [19]
Bleich et al.

[11] Patent Number: 5,074,558
[45] Date of Patent: Dec. 24, 1991

[54] MATRIX ADDRESS DECODER FOR PINBALL GAMES

[75] Inventors: Charles R. Bleich, Cary; Mark J. Coldebella, Rolling Meadows, both of Ill.

[73] Assignee: Williams Electronics Games, Inc., Chicago, Ill.

[21] Appl. No.: 625,103

[22] Filed: Dec. 10, 1990

[51] Int. Cl.⁵ .......................... A63F 7/00; A63F 9/00
[52] U.S. Cl. .......................... 273/121 A; 273/119 A; 273/123 A
[58] Field of Search .......... 273/119 R, 119 A, 121 A, 273/123 A, 127 A, DIG. 28, 85 G, 434, 437; 364/410, 411, 412; 365/230.06, 231, 238.5; 200/61.1, 61.11, DIG. 23

[56] References Cited

U.S. PATENT DOCUMENTS

| | | | |
|---|---|---|---|
| 4,085,316 | 11/1977 | Miller | 273/121 A |
| 4,176,844 | 12/1979 | Ryan et al. | 273/121 A |
| 4,367,876 | 1/1983 | Kotoyori | 273/121 A |
| 4,508,343 | 4/1985 | Peters et al. | 273/119 A |
| 4,763,256 | 8/1988 | DeMar | 273/121 A |

OTHER PUBLICATIONS

"Volcano Instruction Manual", Gottlieb Amusement Games, Dec. 1980.
Kinney, Bruce W., "Simplify volume product design with single-chip microcomputers" EDN vol. 23, No. 7, Apr. 1978, pp. 97-103.

*Primary Examiner*—Edward M. Coven
*Assistant Examiner*—Jessica J. Harrison
*Attorney, Agent, or Firm*—William T. Rifkin

[57] ABSTRACT

A matrix address decoder for rolling ball games performs decoding of a sequential identification number and a base address into an offset address corresponding to a memory location containing status information for playfield features or switches. The matrix address decoder also generates a mask byte for use in subsequent logical operations involving the status information contained in memory. The decoded information is returned to the main microprocessor via the system bus. An alternate function returns only the mask byte when the offset address is known by the main microprocessor.

19 Claims, 3 Drawing Sheets

MATRIX ADDRESS DECODER FOR PINBALL GAMES

BACKGROUND AND OBJECTS OF THE INVENTION

The present invention relates to computer-controlled pinball games, and more particularly, to a matrix address decoder for use with such games.

Typically, pinball games employ microprocessors to control operation of various game functions, such as activation of lamps and solenoids in response to pinball-activated switches disposed on the playfield. The microprocessor can also operate score displays based on inputs from these switches. The lamps and playfield features are often designated by sequential numbers for identification. Status information about these playfield features, such as whether the playfield feature is activated or not, is kept in a block of sequential locations in system memory, with each bit of each memory location representing status information about a different one of the specifically numbered playfield features. Similarly, information about the status of the playfield switches, whether electrically open or closed, is kept in a different block of memory. The switches are also sequentially numbered, and each bit of the memory matrix contains the status of a specific one of the switches.

The memory arrays containing information about the playfield features and switches may be thought of as being organized in matrix format, with each bit position in a given memory location corresponding to a column and each successive memory address corresponding to a row location. Information is normally stored in the matrix in a sequence determined by the sequential numbers assigned to the playfield features or switches. For example, the first byte of the information matrix (the byte located at the beginning address) contains information bits corresponding to playfield features or switches numbered one through eight. The next successive memory location contains the information for switches or playfield features nine through 16. Thus, information about a specific playfield feature or switch may be accessed by the system microprocessor if both the sequential number assigned to the switch or playfield feature and the starting memory address of the information matrix are known.

In the course of game play, the system microprocessor must translate the sequential number assigned to a playfield feature or switch in order to access the memory location containing the information for the proper device. This task is a matter of simple mathematical calculation, which the microprocessor can perform. However, manipulation of these bits of status information can consume a substantial portion of the microprocessor's time, limiting the time available for other important tasks. As the number of playfield features and switches increases, the amount of processing time spent performing these decoding computations also increases, further reducing the amount of processing time available for other operations.

It is desirable to relieve the system microprocessor of the need to perform repetitive manipulations of data to obtain status information about playfield features and switches. One possible solution would be to include a separate co-processor having full processing capabilities. But this would be relatively expensive to implement and would needlessly increase the complexity of the pinball game operating system. Another option would be to use a look-up table for relating the sequential number of the playfield features and switches to the corresponding memory location and bit position. But this option would also require a substantial amount of processing time. The system would still be subject to limitations of efficiency.

Accordingly, it is an object of the invention to provide a dedicated matrix address decoder to decode the memory location and bit position of status information relating to a specific playfield feature or switch when both the sequential number of the device for which information is sought and the starting address for the information matrix are known.

It is another object of the invention to provide such a dedicated matrix address decoder requiring a minimum of communication with the main microprocessor.

It is a further object of the invention to provide such a matrix address decoder which is implemented at low cost and without unnecessarily expanding game complexity.

These objects, as well as others, will become apparent to those skilled in the art from the detailed description of the invention provided below.

SUMMARY OF THE INVENTION

The present invention is a matrix address decoder for rolling ball games having limited capability in comparison to the game's main microprocessor. The matrix address decoder performs decoding of the memory address containing status information for playfield features and playfield switches. The present invention decodes the proper memory address when both a predefined sequential identification number for a playfield feature and the starting memory address of the information matrix are known. The decoding operation performed by the matrix address decoder requires the transfer of only three bytes of information from the main microprocessor: a one-byte sequential identification number of the device for which information is sought and a two-byte starting memory address of the proper status information matrix. The decoded memory information is returned to the main microprocessor by a single read instruction. The matrix address decoder also produces a logical mask byte for use by the main microprocessor in performing subsequent logical operations with the desired status information. The mask byte is returned to the main microprocessor by a second read operation. The main microprocessor is spared the inefficient task of executing repetitive software subroutines to decode the memory addresses containing playfield status information.

An alternate function of the present invention employs only a single write instruction, which transmits the sequential identification number to the matrix address decoder. A logical mask byte is returned by a single read instruction. This function is useful when the exact memory location of the status information is already known by the system microprocessor.

DETAILED DESCRIPTION OF THE PREFERRED EMBODIMENT

Figure 1:
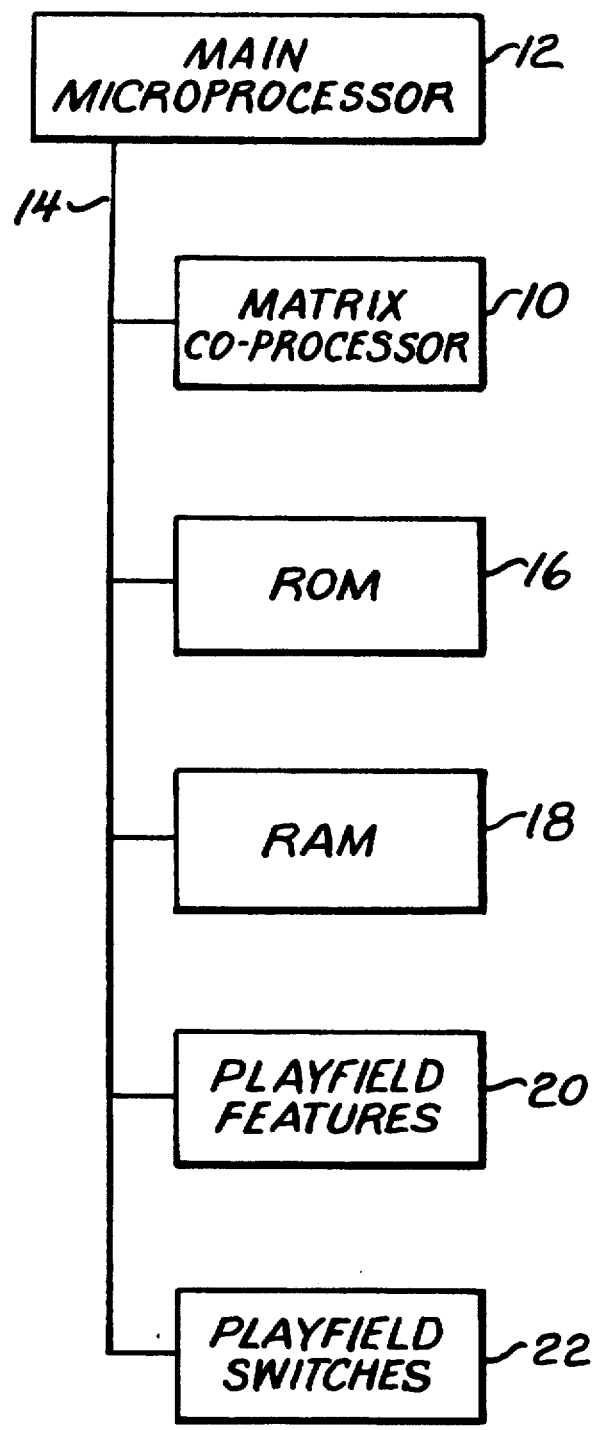
FIG. 1 is a block diagram the operating system of a pinball game, including the matrix address decoder of the present invention.

As shown in FIG. 1, a matrix address decoder 10 is used in conjunction with a main microprocessor 12. The two processors are connected via bus 14. The main processor 12 (for example, a Motorola MC6800 series microprocessor), executes the game software, which monitors the status of playfield features and controls various game functions. The game operating software is stored in a read-only memory ("ROM") 16, while status information generated during play relating to the status of play features is stored in a random access memory (RAM) 18, which may be updated as play progresses. The ROM 16 and RAM 18 are also connected to the main processor 12 by the bus 14. The main processor 12 is also connected to a plurality of playfield features 20 (for example, lamps, bumpers and ball ejectors) and playfield switches 22 via the bus 14. The switches 22 signal the main processor 12 when contacted by the pinball on the playfield. The main processor may control operation of the playfield features 20 via communication on the bus 14.

Figure 2:
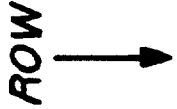
FIG. 2 is a diagram of a block of memory locations that contain status information about playfield features or switches.

FIG. 2 shows a typical block of memory locations in the RAM 18 used by the microprocessor 12 to keep track of status information. As can be seen from FIG. 2, this arrangement may be thought of as a matrix in which subsequent memory locations represent rows and each bit position represents a column. It should be noted that information about playfield features is preferably kept in a separate block of memory from the information for ball-activated switches. The memory address locations shown are for purposes of example only. The starting address of a given memory matrix is referred to as the base address.

The playfield features and switches are normally given sequential identification numbers. For example, the playfield features may be numbered one through 64 while the switches are also numbered one through 64, but information for the playfield features is stored at a different area of RAM memory. The numbers shown in the cells of the FIG. 2 matrix represent the sequential identification number assigned to specific playfield features or switches. For example, the bit of information stored in memory location 1003, fifth bit position, corresponds to playfield feature or switch number 29. For simplicity, the generic term "feature number" is used hereafter to refer to the sequential identification number of either playfield features or switches. The distinction between the two is irrelevant for purposes of explaining the operation of the matrix address decoder of the present invention.

When the microprocessor 12 requires the status of a specific switch (or seeks to control a playfield feature), it must retrieve the proper byte of information from the RAM 18 and read the proper bit of the byte contained therein. An example is useful in explaining the steps taken by the microprocessor 12 to decode a feature number.

Assume the processor 12 needs the information about feature number 29. The microprocessor 12 must translate the feature number into a corresponding memory address and bit position. On method of performing this decoding function is with a software subroutine. Such a routine would identify an address offset to be added to the base address to determine the memory location in the array containing the bit of interest. If the feature number is thought of as a binary number, it will be obvious that the address offset may be computed by dividing the feature number by eight. In other words, the address offset may be determined by the microprocessor by shifting the binary feature number three bits to the right. The binary representation of the feature number 29 is 0001 1101. Shifting this number three bits to the right yields 0000 0011, or decimal three. Adding three to the base address 1000 (see FIG. 2), results in an offset address location of 1003. As can be seen from the drawing, location 1003 contains the information for feature number 29.

Next, the proper bit location of this address must be identified. As will be apparent, the three least significant bits of the binary feature number may be used to identify the proper bit position for a given feature number. For example, the three least significant bits of 0001 1101 (decimal 29) are 101 or decimal 5. As can be seen from FIG. 2, bit position 5 of location 1003 corresponds to feature number 29. In a software decode routine, this function could be accomplished by masking the five most significant bits of the feature number (for example performing a logical AND of the feature number and 0000 0111).

After the microprocessor has retrieved the proper status byte from the decoded address in the RAM 18, it may use the bit position information to generate a mask byte to use in subsequent logical operations with the status byte. A common mask byte would consist of a single logical 1 in the bit position corresponding to the feature number of interest. For example, the mask bit for use with feature number 29 would be 0010 0000. The mask byte may be used to isolate the status information for feature number 29 by logically ANDing the mask byte with the status byte from the RAM 18.

Although such operations are not complex, it will be obvious that repetitive execution of these mathematical operations can occupy a great deal of processing time in a modern pinball game with many switches and playfield features. As more manipulation of feature number information is demanded by more complex games, the efficiency of the main microprocessor 12 is dramatically reduced.

The matrix address decoder 10 decodes feature number information received from the main processor 12 via bus 14. Upon completion of the decoding operation, the matrix address decoder 10 transmits the offset address location and mask byte back to the main processor. The main processor uses the decoded information to activate the proper playfield feature or update scoring. The main processor is thus relieved of the task of performing repetitive mathematical decoding operations with software.

Figure 3:
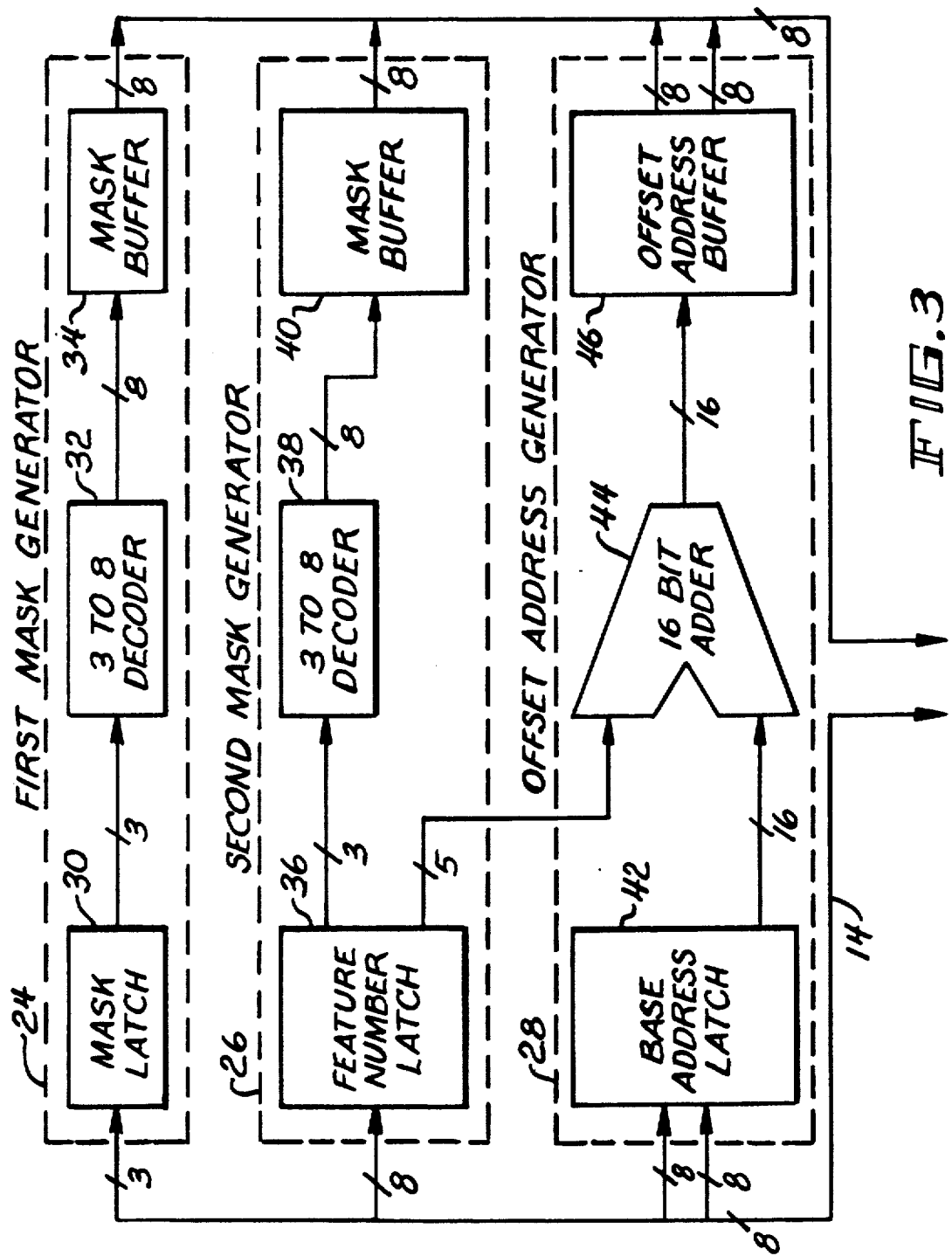
FIG. 3 is a block diagram showing the matrix processor of the present invention.

FIG. 3 is useful in explaining the operation of the matrix address decoder 10, which consists of three functional blocks: a first mask generator 24, a second mask generator 26 and an offset address generator 28. The operation of the mask generators is identical; however, the first mask generator 24 operates as a stand-alone while the second mask generator 26 operates in conjunction with the offset address generator 28. The first mask generator is employed when the exact memory address of the desired status byte is known in advance and need not be decoded (for example, when the information matrix consists of a single row). The second mask generator 26 and offset address generator 28 operate t provide the offset and mask byte as previously defined in the example.

With regard to the operation of the first mask generator 24, the main processor 12 transmits the three least significant bits of the feature number via data bus 14 to a mask latch 30 (for example, a flip-flop). Once latched by the mask latch 30, the three-bit number is presented to a three-to-eight decoder 32. The decoder 32 has eight outputs, one of which corresponds with each of the eight possible three bit input combinations. The output which corresponds to the three-bit input is set to a logical one while the remaining seven outputs remain set at a logical zero. The eight-bit output from the decoder 32 (the mask byte) is passed to a mask buffer 34, where it may be read by the main processor 12 via bus 14.

In generating this mask, the main processing unit is required to execute only two software instructions: a write command (to write the three-bit number to the mask latch 30), and a read instruction (to read the mask byte from the first mask buffer 34). The reduced software requirements allow reduction of the total amount of system memory. Substantial economies of processing time are also achieved because the data manipulation performed by the mask generator 24 is independent of any action of the main processor 12.

The second mask generator 26 operates similarly, but in conjunction with the address offset generator 28. An eight-bit binary feature number is written by the main processor 12 into a feature number latch 36. The three least significant bits are passed to a three-to-eight decoder 38. The five most significant bits, which represent the feature number divided by eight, are used by the offset address generator 28, as will be described hereinafter. From this point on, the second mask generator 26 operates substantially the same as the first mask generator 24. The decoder 38 sets the corresponding output line to a logical high state. The other seven decoder outputs remain in the logical low state. The mask byte output from the decoder 38 is passed to a second mask buffer 40, where it may be read by the main processor 12 via bus 14.

As to the operation of the address offset generator 28, a sixteen-bit number corresponding to the base address of the memory matrix containing the feature in question is written by the main processor 12 into a base address latch 42. This sixteen-bit number is transferred to a sixteen-bit adder 44.

The upper five bits of the of the eight-bit number latched into the feature number latch 36 are also presented to the sixteen-bit adder 44 via lines 45. The adder sums the upper five bits and the sixteen-bit base address. The offset address resulting from this addition is placed in an offset address buffer 46 where it may be read by the main processor 12 via bus 14. Thus, the feature number is decoded using only two write operations which write numbers into the feature number latch 36 and the base address latch 42, and two read statements for reading numbers from the mask buffer 40 and the offset address buffer 46.

The simplified operations of the matrix processor enables faster real time processing of information. This desirably provides greater flexibility in game operations, and faster response time to playfield activities, which is considered advantageous by players of pinball games.

The present invention has been described with respect to certain embodiments and conditions, which are not meant to limit the invention. Those skilled in the art will understand that variations from the embodiments and conditions described herein may be made without departing from the invention as set forth in the appended claims.

What is claimed is:

1. A control system for pinball games having a plurality of playfield features and switches, comprising:
   a) a microprocessor for controlling said playfield features and for receiving inputs from said playfield switches, each playfield feature and switch having a unique identification number associated therewith;
   b) a random access memory (RAM) associated with the microprocessor for storing status information relating to the playfield features and switches, said status information being stored in a unique memory location in said RAM corresponding to said identification number, and;
   c) an address decoder for decoding each identification number into its corresponding memory location in said RAM, whereby the microprocessor is relieved of the task of executing repetitive software subroutines to decode the identification number, permitting processor control of additional playfield features and switches and/or allowing the processor to operate faster.

2. The control system of claim 1 wherein said system includes a bus structure for allowing said microprocessor to communicate with said playfield features and switches and to transmit and receive information from said RAM and said address decoder.

3. The control system of claim 1 wherein said playfield features consist of solenoid-driven bumpers and ball ejectors 4. The control system of claim 1 wherein said switches are disposed on the playfield of said pinball game for activation when contacted by a pinball.

5. A control system for pinball games having a plurality of playfield features and switches, comprising:
   a) a microprocessor for controlling said playfield features and for receiving inputs from said playfield switches, each playfield feature and switch having a unique identification number associated therewith;
   b) a random access memory (RAM) associated with the microprocessor including at least one memory matrix for storing status information relating to the playfield features and switches, each matrix having a known starting address, the status information for each playfield feature and switch being locatable by specifying a offset address relative to said starting address and a bit position in said memory matrix, each combination of offset address and bit position uniquely corresponding to one of said identification numbers, and;
   c) a matrix address decoder for decoding said identification numbers into corresponding offset addresses and bit positions in said RAM and for communicating said offset addresses and bit positions to said microprocessor, whereby the microprocessor is relieved of the task of executing repetitive software subroutines to decode the identification number, permitting processor control of additional playfield features and switches and/or allowing the processor to operate faster.

6. The control system of claim 5 wherein said system includes a bus structure for allowing said microprocessor to communicate with said playfield features and switches and to transmit and receive information from said RAM and said address decoder.

7. The control system of claim 5 wherein said playfield feature include solenoid-driven bumpers and ball ejectors.

8. The control system of claim 5 wherein said switches are disposed on the playfield of said pinball game for activation when contacted by a pinball.

9. The control system of claim 5 wherein said matrix address decoder further comprises means for generating a mask byte for identifying the bit position in the memory location identified by the offset address, said mask byte having a logical one in the bit position corresponding to the identification number and a logical zero in every other bit position.

10. The control system of claim 5 wherein said matrix address decoder further comprises means to generate said offset address from said starting address and said identification number.

11. The control system of claim 5 wherein said RAM includes two memory matrices, one for status information relating to said playfield features and one for status information relating to said switches.

12. A control system for pinball games having a plurality of playfield features and switches, comprising:
 a) a microprocessor for controlling said playfield feature and for receiving inputs from said playfield switches, each playfield feature and switch having a unique identification number associated therewith;
 b) a random access memory (RAM) associated with the microprocessor including at least one memory matrix for storing status information relating to the playfield features and switches, each matrix having a known starting address, the status information for each playfield feature and switch being locatable by specifying an offset address relative to said starting address and a bit position in said memory matrix, each combination of offset address and bit position uniquely corresponding to one of said identification numbers, and;
 c) a matrix address decoder for decoding said identification numbers into corresponding offset addresses and bit positions in said RAM and for communicating said offset addresses and bit positions to said main microprocessor, said matrix address decoder comprising:
  i) means for generating said offset address, and;
  ii) means for generating a mask byte for identifying the bit position in the memory location identified by the offset address that contains the status information corresponding to the identification number, said mask byte having a logical one in the bit position corresponding to the identification number and a logical zero in every other bit position,
whereby the microprocessor is relieved of the task of executing repetitive software subroutines to decode the identification number, permitting processor control of additional playfield features and switches and/or allowing the processor to operate faster.

13. The control system of claim 12 wherein said system includes a bus structure for allowing said microprocessor to communicate with said playfield features and switches and to transmit and receive information from said RAM and said address decoder.

14. The control system of claim 12 wherein said playfield features include solenoid-driven bumpers and ball ejectors.

15. The control system of claim 12 wherein said switches are disposed on the playfield of said pinball game for activation when contacted by a pinball.

16. The control system of claim 12 wherein said offset address is generated from said starting address and said identification number.

17. A method for controlling pinball type games having a plurality of playfield features and switches, comprising the steps of:
 a) employing a microprocessor to control said playfield features and to receive inputs from said switches, each playfield feature and switch having a unique identification number associated therewith;
 b) providing a random access memory (RAM) associated with the microprocessor having at least one memory matrix for storing status information relating to the playfield features and switches, each matrix having a known starting address, the status information for each playfield feature and switch being locatable by specifying an offset address relative to said starting address and a bit position in said memory matrix, each combination of offset address and bit position uniquely corresponding to one of said identification numbers, and;
 c) decoding, independently of said microprocessor, said identification numbers into corresponding offset addresses and bit positions in said RAM, and;
 d) communicating said offset addresses and bit positions to said microprocessor,
whereby the microprocessor is relieved of the task of executing repetitive software subroutines to decode the identification number, permitting processor control of additional playfield features and switches and/or allowing the processor to operate faster.

18. The method of claim 17 wherein the step of decoding further comprises the substep of generating a mask byte for identifying the bit position in the memory location identified by the offset address, said mask byte having a logical one in the bit position corresponding to the identification number and a logical zero in every other bit position.

19. The method of claim 17 wherein the step of decoding further comprises the substep of generating said offset address from said starting address and said identification number.

* * * * *